United States Patent

Sheck

[11] Patent Number: 5,311,061
[45] Date of Patent: May 10, 1994

[54] ALIGNMENT KEY FOR A SEMICONDUCTOR DEVICE HAVING A SEAL AGAINST IONIC CONTAMINATION

[75] Inventor: Stephen G. Sheck, Marble Falls, Tex.

[73] Assignee: Motorola Inc., Schaumburg, Ill.

[21] Appl. No.: 63,474

[22] Filed: May 19, 1993

[51] Int. Cl.$^5$ ............................................ H01L 23/544
[52] U.S. Cl. .................................... 257/797; 257/773; 257/774; 257/758
[58] Field of Search ............... 257/758, 774, 797, 763, 257/691, 773

[56] References Cited

U.S. PATENT DOCUMENTS

| | | | |
|---|---|---|---|
| 3,366,159 | 1/1968 | Pritchard, Jr. et al. | 257/758 |
| 4,755,750 | 7/1988 | Leuschner | 324/158 |
| 4,893,163 | 1/1990 | Rudeck | 257/797 |
| 4,962,058 | 10/1990 | Cronin et al. | 257/758 |
| 4,970,572 | 11/1990 | Kato et al. | 257/758 |

FOREIGN PATENT DOCUMENTS

| | | | |
|---|---|---|---|
| 126621 | 11/1984 | European Pat. Off. | 257/797 |
| 289274 | 4/1987 | European Pat. Off. | 257/774 |
| 2-307206 | 12/1990 | Japan | 257/797 |
| 3-62565 | 3/1991 | Japan | 257/773 |
| 3-179756 | 8/1991 | Japan | 257/797 |
| 4-159706 | 6/1992 | Japan | 257/797 |

Primary Examiner—William D. Larkins
Assistant Examiner—T. M. Arroyo
Attorney, Agent, or Firm—Jasper W. Dockrey

[57] ABSTRACT

An alignment key (10) in a semiconductor substrate (40) is fabricated to display high optical contrast, and to prevent the diffusion of ionic contaminants through the alignment key (10) and into underlying portions of the semiconductor substrate (40). The alignment key (10) defines an enclosed structure formed by first and second metal layers (14, 20) which are electrically coupled by a filled via (22). A dielectric layer (42) is disposed between the metal layers (14, 20). A passivation layer (16) overlies an edge portion of the upper metal layer (14), however, the central portion of the upper metal layer (14) is bare. Slots (11, 12) in the upper metal layer (14) expose a portion of the lower layer (20) through the dielectric material (42). A high contrast scan signal (24) is generated as a continuous-wave laser beam traverses across the upper metal layer (14) and the slots (11,12). The scan signal is analyzed by a computer algorithm to determine the vertical and horizontal position of a semiconductor substrate (40) having multiple alignment keys (10) of the invention.

10 Claims, 3 Drawing Sheets

5,311,061

ALIGNMENT KEY FOR A SEMICONDUCTOR DEVICE HAVING A SEAL AGAINST IONIC CONTAMINATION

FIELD OF THE INVENTION is invention relates in general to semiconductor devices, and more particularly to optical alignment keys used for aligning a semiconductor substrate.

BACKGROUND OF THE INVENTION

As semiconductor technology advances, more and more device components are being placed on a single semiconductor die. This phenomenon is especially apparent in the area of memory device fabrication. A typical VLSI memory device contains many thousands, and even millions of transistors for the storage of information. The increased complexity of semiconductor memory devices has resulted in a corresponding increase in the size of each semiconductor die, and in the cost for fabricating the die. The increased cost arises, in part, from the need to reduce the number of defects in each semiconductor die. In view of the high fabrication costs, a semiconductor manufacturer must obtain maximum yield of semiconductor memory devices, and must obtain maximum yield at an early point in the product life cycle of any particular semiconductor product.

Because of the need to obtain optimum yield, memory designers have for a number of years included redundant circuitry within the memory array of the devices. The redundant circuitry can be activated to compensate for primary circuits, which are non-functional because of processing defeats. The redundant circuitry is activated by selectively destroying fusible links at predetermined locations in the device circuitry. The process of de-selecting damaged portions of the memory circuit and activating undamaged portions by destroying selective fusible links is known as laser repair. An optical alignment system is used to position the semiconductor die to be repaired at a specific location where a laser beam can be trained on a predetermined fusible link. The optical alignment system has the capability of recognizing certain highly reflective features, such as alignment keys, on a wafer with high accuracy. Once a wafer is placed on the alignment system, the alignment keys are used by the optical system to align the wafer stage to the laser beam. The alignment keys are placed at strategic locations on the wafer and in the die area such that proper alignment of the laser to the fusible links can be obtained. The alignment keys must be positioned such that the wafer can be aligned in both the vertical and horizontal directions. In addition, because semiconductor wafers have a circular geometry, a rotational correction must also be made as the stage moves to various locations on a wafer.

An alignment key is typically two strips of metal laid out perpendicular to each other in either an "L" shape, or a disjointed "T" shape. In operation, the laser repair tool scans a continuous wave laser beam across the alignment keys, integrating the photo-reflective response to determine as precisely as possible the exact location of the keys. Once the key locations are known, the fuse locations are known. After the laser repair tool aligns itself to the die, it steps to the appropriate fusible links on that die and cuts them with an intense laser pulse. If the laser repair tool fails to align itself to the die, the die is not repaired, and the entire device will remain nonfunctional.

Because of the high cost associated with memory device fabrication, it is important that a repairable die not be lost as a result of failure to properly align the laser repair tool to the repairable die. To enable precise alignment of the die to the laser repair tool, the alignment key must be highly reflective and must be readily identifiable by the optical alignment system. To be readily identifiable, the optical system must be able to precisely detect the edges of the metal strips in the alignment key. High reflectivity and precise edge detection are most readily obtained by a large alignment key having metal edges which are free from any overlying passivation layers.

As memory device manufacturing costs rise, it becomes less economically feasible to devote a large die area to the fabrication of alignment keys. Further, while providing a highly reflective surface, removing the passivation layers to expose bare metal edges in an alignment key, can provide a location where ionic contaminates can diffuse into underlying circuit components, and cause device failure. Accordingly, the alignment keys of the prior art suffer from either poor reflectivity leading to die alignment failure, or provide a conduit for ionic contaminates to diffuse into the integrated circuit.

SUMMARY OF THE INVENTION

In practicing the present invention there is provided a high precision laser alignment key for aligning a semiconductor die to a laser repair tool. The alignment key of the invention provides clearly defined edges for precise edge detection by an optical alignment system. Additionally, the alignment key of the invention provides an ion trap which prevents ionic contamination from diffusing away from the alignment key and into adjacent circuit components. The compact and versatile design of the alignment key enables the alignment key to be placed in a variety of locations in an integrated circuit device, and to be integrated with existing metal bus lines. In one embodiment of the invention, a first metallic region overlies a semiconductor substrate. A first dielectric layer overlies the first metallic region. A filled via is disposed in the dielectric layer at the perimeter of the first metallic region. A second metallic region overlies the dielectric layer, the second metallic region has an opening positioned within the perimeter of the first metallic region and is electrically coupled to the first metallic region by the filled via.

BRIEF DESCRIPTION OF THE DRAWINGS

FIGS. 4-1 through 4-4 illustrate, in cross-section, process steps used to fabricate the alignment key of the invention.

Figure 1:
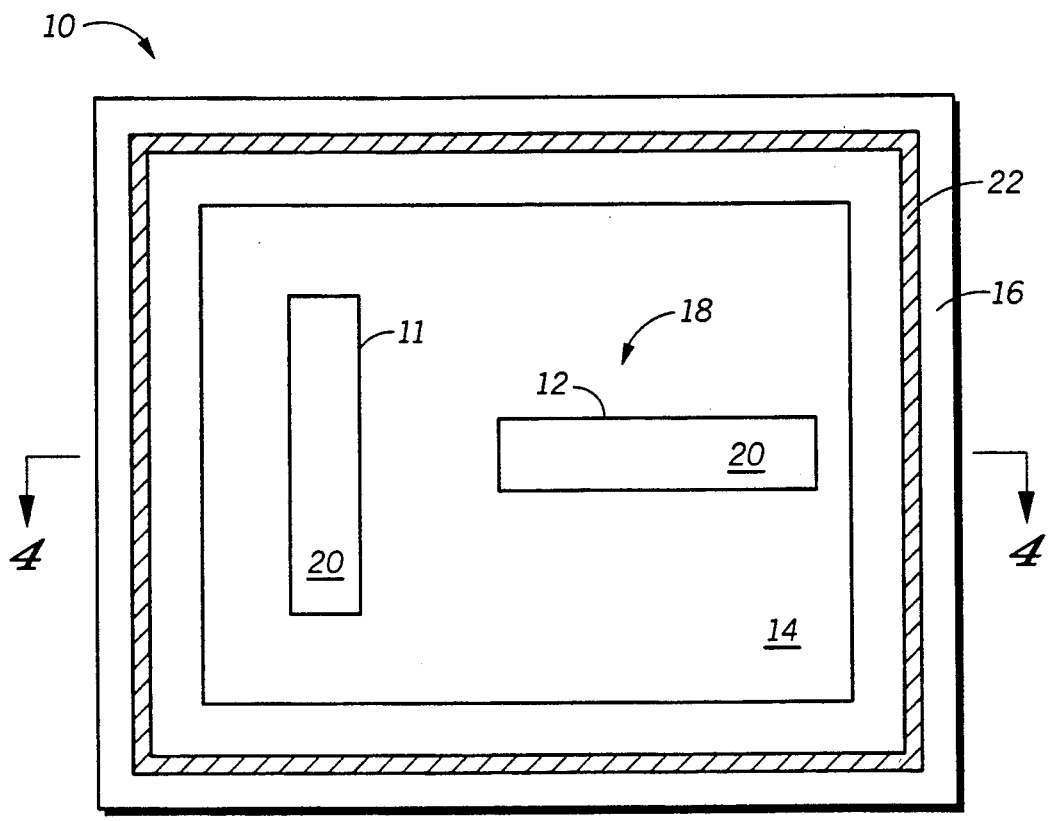
FIG. 1 illustrates, in plan view, an alignment key in accordance with the invention.

It will be appreciated that for simplicity and clarity of illustration elements shown in the FIGURES have not necessarily been drawn to scale. For example, the dimensions of some of the elements are exaggerated relative to each other for clarity. Further, where considered appropriate, reference numerals have been repeated among the FIGURES to indicate corresponding elements.

DETAILED DESCRIPTION OF PREFERRED EMBODIMENTS

FIG. 1, illustrates, in plan view, an alignment key 10 formed in accordance with the invention. Alignment key 10 includes perpendicularly arranged slots 1 1 and 12 residing in a metal layer 14. A passivation layer 16 overlies an edge portion of metal layer 14 and has a rectangular opening 18. Opening 18 exposes an interior portion of metal layer 14. Perpendicular slots 11 and 12 expose portions of an underlying metal layer 20, and a filled via 22 is disposed at the perimeter of the underlying metal layer 20. Filled via 22 electrically couples metal layer 14 to metal layer 20. Alignment key 10 provides a structure that can be used to position a semiconductor die in a vertical direction (Y) and a horizontal direction (X). For example, the wafer is positioned in the X direction by scanning a laser beam across slot 11 in the horizontal direction. Correspondingly, the wafer is positioned in the vertical direction by scanning a laser beam across slot 12. By comparing two or more such alignment keys disposed at various locations on a semiconductor wafer, the rotational orientation $\theta$ can be determined with respect to a reference axis. Alignment key 10 is a self contained alignment structure that can be fully integrated into a conventional semiconductor fabrication process which uses two or more layers of metal. Additionally, as will subsequently be described, the alignment key of the invention provides high precision die alignment capability, while minimizing ionic contamination from the external environment.

Figure 2:
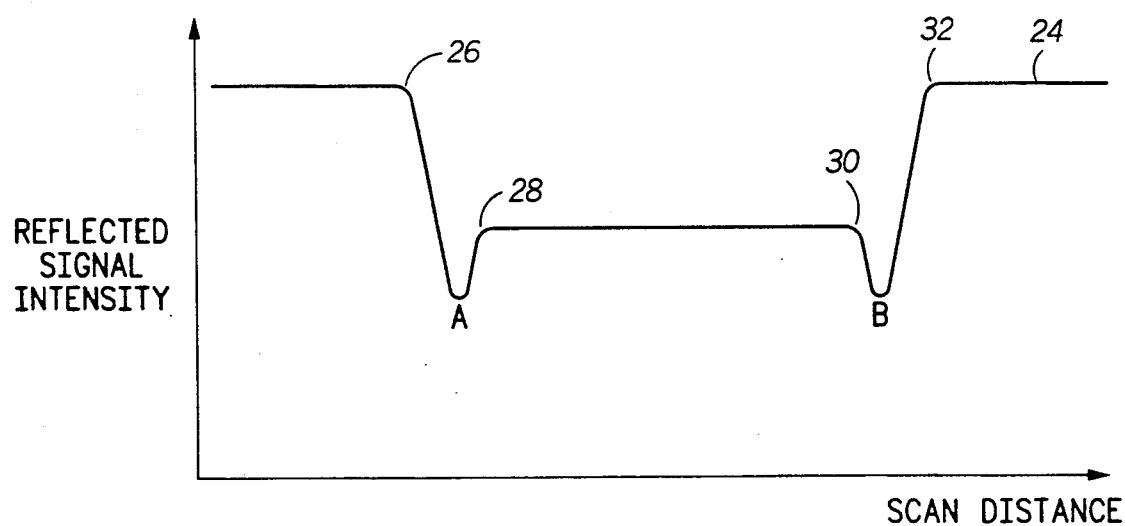
FIG. 2 is a plot of a scan signal generated by an optical scanning system applying a laser beam to one slot of the alignment key shown in FIG. 1.

A representative scan signal 24 is illustrated in the plot of FIG. 2. The scan signal given as the amplitude of reflected laser light as a function of scan distance across one direction of alignment key 10. Those skilled in the art will recognize that the scan signal illustrated in FIG. 2 could be produced by scanning in either the X or Y direction across alignment key 10. For purposes of discussion, the scan signal illustrated in FIG. 2 will be described with reference to slot 11 of alignment key 10. Scan signal 24 can be generated by a laser operating in the visible or infrared ranges of the electromagnetic spectrum. Commonly used lasers which can be used with the present invention are a Nd:YAG laser operating at a wavelength of either 532 nm or 1064 nm, or a solid-state pumped laser operating at 1047 nm, or the like. As the laser beam tracks across alignment key 10 from left to right, an initial high intensity reflected signal is obtained. The high intensity reflected signal originates from laser light reflected from the surface of metal layer 14. As the laser beam approaches the left side of slot 11, an inflection point 26 is encountered and the reflected signal intensity drops to a minimum inflection point A. Subsequently, as the scan continues, the signal increases to a second inflection point 28. The reflected signal intensity at inflection point 28 is substantially less than the reflected signal intensity at inflection point 26. The difference in the intensity of reflected light at points 26 and 28 is related to the beam path difference between light reflected from metal layer 14 and light reflected from metal layer 20. In addition, the difference in reflected signal intensity results from light absorption by a dielectric layer overlying metal layer 20 (not shown in FIG. 1). As the laser beam continues to traverse slot 11, inflection points 30 and 32 are encountered.

The exact location of slot 11 in the horizontal direction can be specified by a computer program which analyzes scan signal 24 and determines the locations of the edges of slot 11 in regions A and B of scan signal 24. Once the location of slot 11 has been determined in the horizontal direction, the scanning procedure can be repeated in the vertical direction and the location of slot 12 determined by an analogous scanning procedure.

Figure 3:
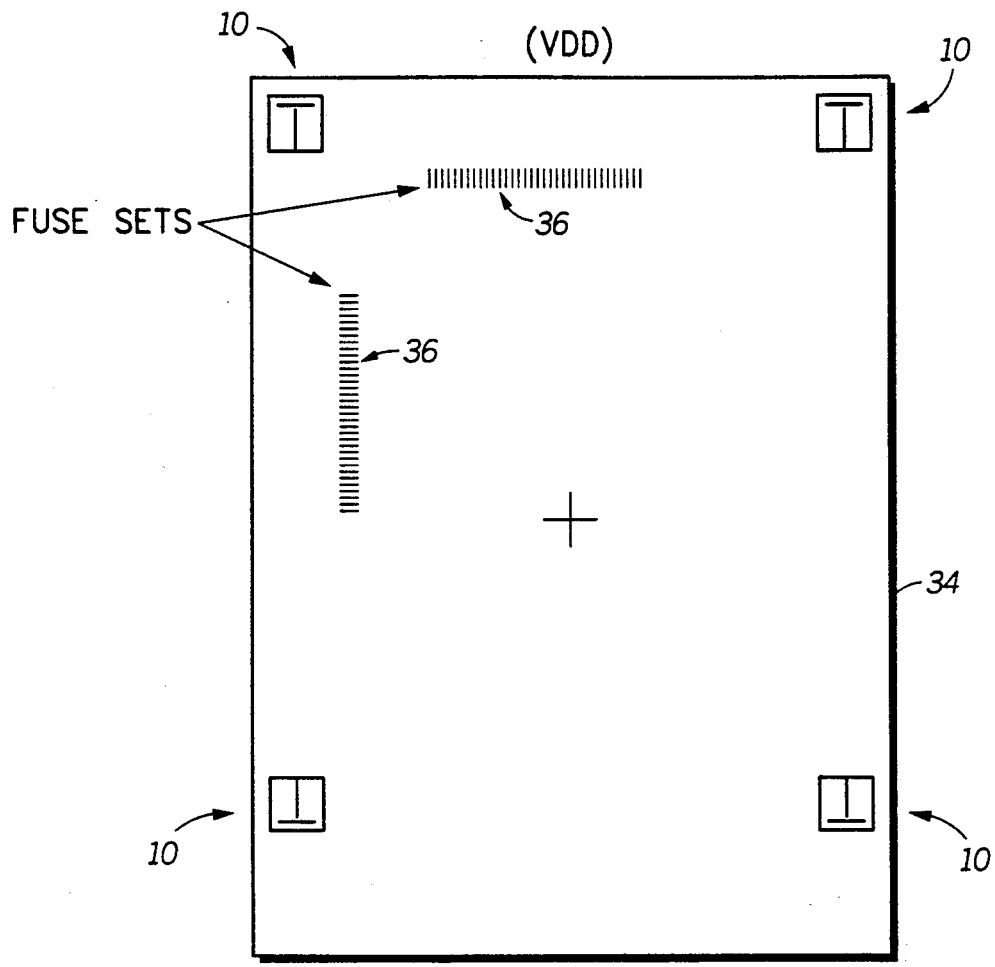
FIG. 3 illustrates, in plan view, a semiconductor die having alignment keys of the invention positioned at predetermined locations on a semiconductor die.

Alignment key 10 can be used to position a semiconductor die 34 in the horizontal, vertical, and rotational directions by placing three or more alignment keys at selective locations on semiconductor die 34. As illustrated in FIG. 3, alignment keys 10 have been positioned near the corners of semiconductor die 34. The selective positioning of alignment keys 10 enables the precise alignment of semiconductor die 34 prior to the application of a laser discharge on fuse sets 36. Targeting a laser beam on fuse sets 36 selectively disables defective portions of, for example, a memory array in semiconductor die 34.

Figures 1, 4:
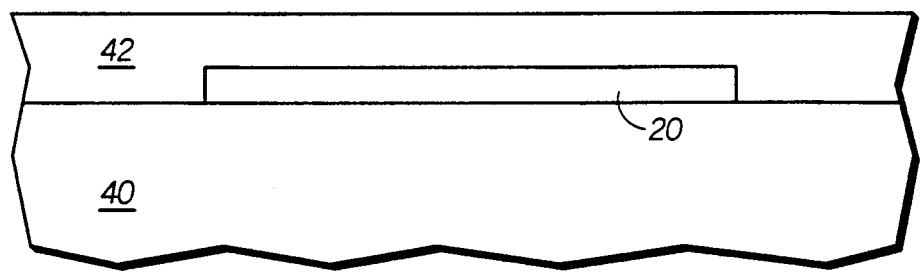
Figures 2, 4:
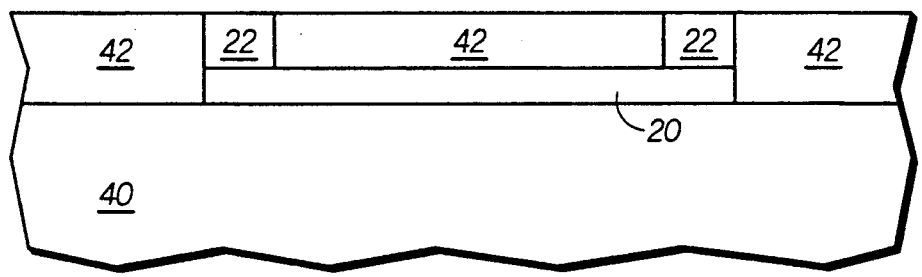
Figures 3, 4:
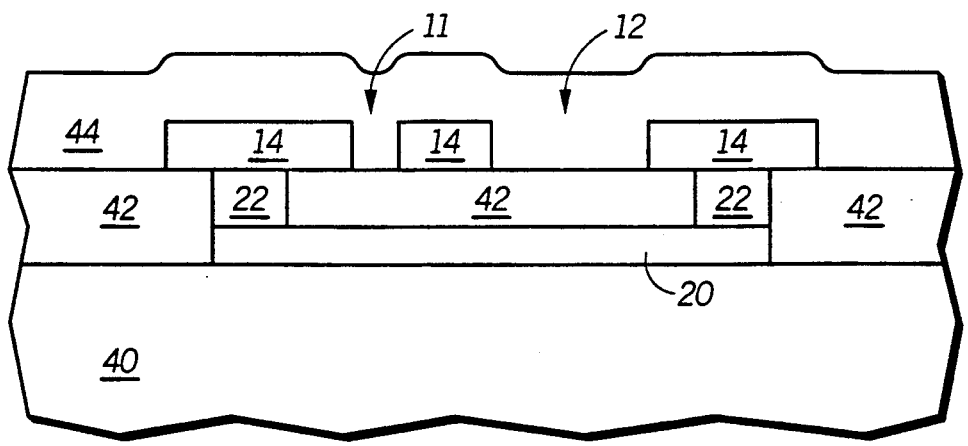
Figure 4:
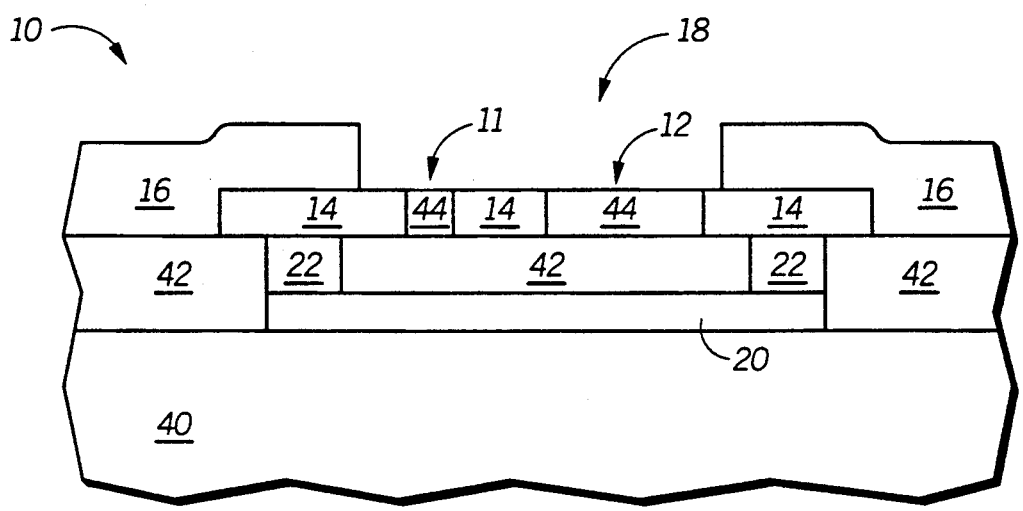

The structural detail of alignment key 10 giving rise to scan signal 24 in FIG. 2, can be better understood following a description of the subsequent process steps used in the fabrication of alignment key 10. Accordingly, the fabrication of alignment key 10 is illustrated in the subsequent process steps shown in FIGS. 4-1 through 4-4. FIGS. 4-1 through 4-4 illustrate, in cross section, a portion of alignment key 10 taken along line 4-4 of FIG. 1.

Shown in FIG. 4-1, in cross section, is a portion of a semiconductor substrate 40 having already undergone several process steps in accordance with the invention. A metal layer 20 overlies the surface of substrate 40, and a dielectric layer 42 overlies metal layer 20 and portions of the surface of semiconductor substrate 40. Metal layer 20 is preferably formed by depositing a blanket layer of metal onto the surface of substrate 40, followed by photolithographic patterning and etching the metal layer. The etching process removes portions of the deposited metal layer which are exposed by the photolithographic pattern. Metal layer 20 can be etched in a wet metal etching solution, or in a dry plasma etching system.

In one aspect, the invention is intended to be fully integrated into a conventional double level metal process. Typically, the metal used to form metal layer 20 is an aluminum alloy with a small amount of silicon or copper, or both. Alternatively, metal layer 20 can be a another reflective metal such as copper, titanium, tungsten, and the like. Most commonly, aluminum is deposited by reactive sputter deposition, however, other processes can be used such as chemical vapor deposition. Dielectric layer 42 is a conventional interlevel dielectric material such as silicon oxide, silicon nitride, or a doped glass layer such as phosphorus silicate glass, boron silicate glass, and the like. Following deposition of dielectric layer 42, a planarization process is performed to provide a smooth surface.

Those skilled in the art will appreciate that, although detailed structure is not shown in FIG. 4-1, a metallization process, such as that forming metal layer 20, is typically not performed until after many components of an IC device have been formed on substrate 40. Accordingly, although not shown in FIGS. 4-1 through 4-4, it is intended that substrate 40 include all such components that are typically fabricated in an integrated circuit manufacturing process prior to the formation of the first metal layer.

After dielectric layer 42 has been deposited and planarized, filled via 22 is formed as illustrated in FIG. 4-2. Filled via 22 is preferably formed by defining a photolithographic pattern on dielectric layer 42, followed by reactive ion etching to form openings which expose a peripheral portion of metal layer 20. Once the openings have been formed, a metal is preferably deposited onto the surface of dielectric layer 42 and fills the openings in dielectric layer 42. The metal is then etched back such that a continuous planar surface region is formed, as shown in FIG. 4-2. The metal used to form filled via 22 is preferably tungsten deposited by chemical vapor deposition, or reactive sputtering. Alternatively, the filling metal can be titanium, aluminum, silicon aluminum, copper silicon aluminum, and copper, and the like. It is important that the filling metal form an electrical contact to metal layer 20, therefore, pre-metal cleaning steps are performed as necessary to remove any non-electrically conductive material from the exposed surface regions of metal layer 20. Those skilled in the art will recognize that the process which forms filled via 22 is a conventional via formation process typically used to electrically connect two or more overlying metal layers.

The process continues with the formation of metal layer 14 as illustrated in FIG. 4-3. Following deposition, metal layer 14 is patterned to create slots 11 and 12, which are positioned over the central portion of metal layer 20. Preferably, metal layer 14 is fabricated from a similar metal and by a similar process as metal layer 20. In the selection of metals for metal layers 20 and 14 an important consideration is the refractive index of the particular metals which are selected. It is important that the refractive index of metal layers 14 and 20 be such that a reflective intensity signal similar to scan signal 24, shown in FIG. 2, can be obtained upon scanning a laser beam over slot 11 or 12. Although the relative refractive index of metal layers 14 and 20 is important, the necessary refractive indices are readily obtained and by metals used in a conventional double-level metal process. Typically, metal layers 14 and 20 are formed with metal have the same composition. However, different materials can be used for the formation of metal layers 14 and 20, so long as the relative refractive index requirement is met.

As shown in FIG. 4-3, portions of metal layer 14 overlie filled via 22. To ensure the formation of a good metallurgical contact between metal layer 14 and filled via 22, any non-electrically conductive material is removed from the surface of filled via 22 prior to the formation of metal layer 14. After metal layer 14 is deposited and patterned, a passivation layer 44 is deposited to overlie metal layer 14 and dielectric layer 42. Passivation layer 44 is preferably any conventional passivation material commonly used in an integrated circuit process to protect the second metal layer. Passivation layer 44 can be silicon nitride deposited by a plasma enhanced chemical vapor deposition process, or alternatively, a silicon oxide material which can be dealt with either phosphorous, boron, or both.

After passivation layer 44 is deposited, photolithographic and ion etching steps are carried out to form an opening 18, as illustrated in FIG. 4-4. Following the etching process, the portions of passivation layer 44 overlying portions of metal layer 14 form passivation layer 16 as shown in FIGS. 1 and 4-4. Also, portions of passivation layer 44 remain and fill slots 11 and 12. The surface regions of metal layer 14, exposed through opening 18, provide a highly reflective surface for laser scanning.

The alignment key of the invention advantageously provides a compact, self-contained alignment key, exhibiting clearly defined edges having high optical contrast. The optical contrast enables high precision edge detection by conventional laser-optical equipment. Additionally, ionic contamination, impinging on the outer surfaces of alignment key 10, is prevented from diffusing into the underlying integrated circuit device regions. Filled via 22, disposed between metal layers 14 and 20, forms a ion trapping structure which prevents ionic contaminates from diffusing through alignment key 10 and into underlying IC components. The ability of the alignment key of the invention to trap ionic contamination relieves the necessity of fabricating additional guard ring structures or other ion trapping devices in areas of the integrated circuit device adjacent to alignment key 10. The self contained ionic trapping feature of the invention enables the fabrication of high density devices without an accompanying need to devote large amounts of surface area for the fabrication of ion barriers, such as guard rings, and the like.

Figure 5:
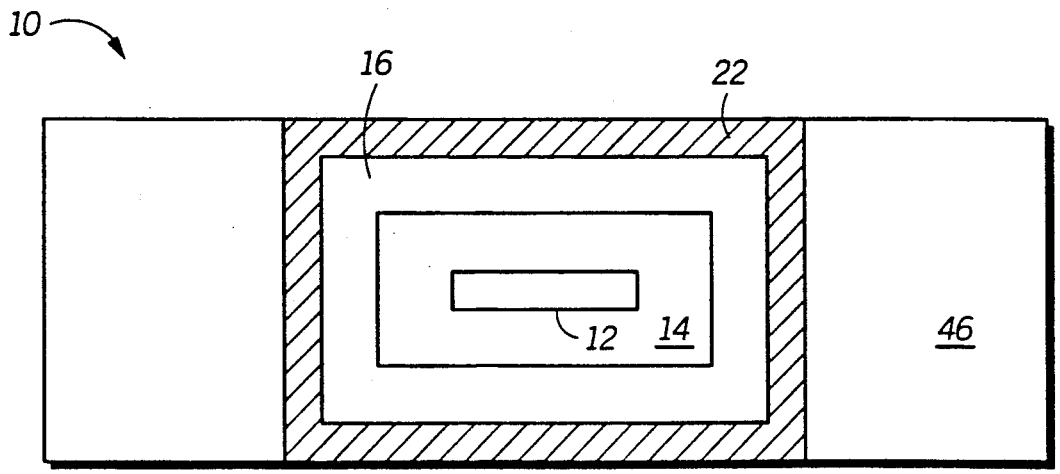
FIG. 5 illustrates, in plan view, the alignment key of the invention integrated with a metal bus line.

The compact and versatile nature of the alignment key of the invention allows the alignment key to be located in a variety of places in an integrated circuit device. One embodiment of the invention illustrating the versatility of the alignment key is shown in FIG. 5. Shown in FIG. 5, in plan view, is a portion of a metal bus line 46 which is integrated with alignment key 10. In the embodiment of the invention illustrated in FIG. 5, bus line 46 provides the same function as metal layer 20 illustrated in FIGS. 1, and in FIGS. 4-1 through 4-4. An ionic contamination trap is formed by filled via 22 which contacts metal bus line 46 and extends upward and contacts metal layer 14. Typically, metal bus lines are fabricated having a narrow width. Accordingly, alignment key 10, as integrated with a metal bus line, can be formed having a single slot oriented parallel to the underlying metal bus line. Wafer alignment in the horizontal direction can be provided by an additional alignment key formed in a bus line which is orthogonally oriented to bus line 46.

Those skilled in the art will appreciate that the integration of alignment key 10 with metal bus lines overlying the integrated circuit further reduces the amount of surface area required to provide the alignment keys. By integrating the alignment keys with existing bus lines, improved circuit layout patterns can be implemented. Improved circuit layout is possible because the circuit design is not required to allow designated sections of the circuit for the formation of independent alignment keys.

Thus it is apparent that there has been provided, in accordance with the invention, an alignment key for a semiconductor device which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, the slots in the alignment key can have a substantially different geometric pattern than that shown in the figures. It is therefore intended to include within the invention all such variations and modifications as fall within the scope of the appended claims and equivalents thereof.

I claim:

1. An alignment key for a semiconductor device comprising:
   a first metallic region overlying a semiconductor substrate, the first metallic region having a plurality of parallel sides forming a perimeter;
   a first dielectric layer overlying the first metallic region;
   a filled via in the dielectric layer disposed continuously about the perimeter of the first metallic region; and
   a second metallic region overlying the dielectric layer, the second metallic region having an opening positioned within the perimeter of the first metallic region, and wherein the second metallic region is electrically coupled to the first metallic region through the filled via.

2. The alignment key of claim 1 further comprising a second dielectric layer overlying an edge portion of the second metallic region.

3. The alignment key of claim 1 wherein the opening is elongated in a predetermined direction parallel to one of the parallel sides.

4. The alignment key of claim 3 further comprising a second elongated opening in the second metallic region, wherein the elongated direction of the second opening is perpendicular to the elongated direction of the first opening.

5. The alignment key of claim 1, wherein the filled via comprises a metal selected from the group consisting of tungsten, titanium, aluminum, silicon aluminum, copper silicon aluminum, and copper disposed within an opening in the first dielectric layer.

6. The alignment key of claim 1, wherein the first and second metallic regions comprise a metal selected from the groups consisting of aluminum, silicon aluminum, copper silicon aluminum, and copper.

7. The alignment key of claim 1, wherein the first and second dielectric layers comprise a dielectric material selected from the group consisting of silicon oxide, silicon nitride, phosphorus silicon oxide, boron silicon oxide, and boron phosphorous silicon oxide.

8. An alignment key for a semiconductor device comprising:
   a metal bus line overlying a semiconductor substrate;
   a first dielectric layer overlying the metal bus line;
   a metal layer overlying the dielectric layer, the metal layer having a perimeter and an opening within the perimeter exposing a portion of the metal bus line through the dielectric layer; and
   a filled via disposed continuously about the perimeter of the metal layer in the dielectric layer electrically coupling the metal layer to the metal bus line.

9. The alignment key of claim 8, wherein the metal layer has first and second sides and a wall surface coupling the first and second sides defining an opening therethrough, and wherein the wall surface is within the perimeter and is elongated in a direction parallel with the metal bus line.

10. The alignment key of claim 8 further comprising a second dielectric layer overlying an edge portion of the metal layer.

* * * * *